(12) United States Patent
Lee et al.

(10) Patent No.: US 9,508,577 B2
(45) Date of Patent: Nov. 29, 2016

(54) SEMICONDUCTOR MANUFACTURING APPARATUSES COMPRISING BONDING HEADS

(71) Applicant: Samsung Electronics Co., Ltd., Suwon-Si, Gyeonggi-Do (KR)

(72) Inventors: Byung Joon Lee, Yongin-si (KR); Masato Kajinami, Tokyo (JP); Yoshiaki Yukimori, Kanagawa (JP); Sang-Yoon Kim, Suwon-si (KR); Hui-Jae Kim, Seoul (KR); Byeong-Kuk Park, Asan-si (KR); Seung Dae Seok, Yongin-si (KR); Jae Bong Shin, Gunpo-si (KR); Byeong Kap Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/337,571

(22) Filed: Jul. 22, 2014

(65) Prior Publication Data
US 2015/0155210 A1  Jun. 4, 2015

(30) Foreign Application Priority Data
Nov. 29, 2013 (KR) .................. 10-2013-0147603

(51) Int. Cl.
*H01L 21/66* (2006.01)
*H01L 21/67* (2006.01)
(Continued)

(52) U.S. Cl.
CPC ... *H01L 21/67259* (2013.01); *H01L 21/67109* (2013.01); *H01L 21/67144* (2013.01);
(Continued)

(58) Field of Classification Search
CPC .................. H01L 21/67096; H01L 21/67259; H01L 2924/00014; H01L 2224/7565; H01L 2224/81801; H01L 2224/8385; H01L 2924/00012; H01L 21/67109; H01L 21/67144; H01L 2224/73204; H01L 2224/755502; H01L 2224/75753; H01L 2224/07
USPC ............................................. 438/15; 219/80
See application file for complete search history.

(56) References Cited

U.S. PATENT DOCUMENTS 7,047,632 B2   5/2006   Arikado
7,743,964 B2   6/2010   Maeda
(Continued)

FOREIGN PATENT DOCUMENTS

EP          02421035 A2      2/2012
JP          2012248778   *  12/2012
(Continued)

*Primary Examiner* — Duy T Nguyen
(74) *Attorney, Agent, or Firm* — Harness, Dickey & Pierce, P.L.C.

(57) ABSTRACT

A semiconductor manufacturing apparatus may include: a pickup unit configured to pick up a chip in a first region of the semiconductor manufacturing apparatus; a bonding head configured to receive the picked-up chip and configured to move from the first region to a top of a circuit board in a second region of the semiconductor manufacturing apparatus; and/or an optical unit configured to detect a bonding position on the circuit board while moving from the first region to the second region. A semiconductor manufacturing apparatus may include: a bonding head including a heater for heating a chip and bonding the chip onto a circuit board; and/or a cooling block, adjacent to the heater, through which cooling liquid flows. The cooling liquid may be removed from the cooling block while the heater generates heat. The cooling liquid may be supplied to the cooling block while the heater is cooled.

3 Claims, 22 Drawing Sheets

(51) Int. Cl.
*H01L 23/00* (2006.01)
*H05K 13/04* (2006.01)

(52) U.S. Cl.
CPC ............... *H01L24/75* (2013.01); *H01L 24/92* (2013.01); *H05K 13/046* (2013.01); *H01L 24/81* (2013.01); *H01L 24/83* (2013.01); *H01L 2224/73204* (2013.01); *H01L 2224/7565* (2013.01); *H01L 2224/7598* (2013.01); *H01L 2224/75502* (2013.01); *H01L 2224/75753* (2013.01); *H01L 2224/75824* (2013.01); *H01L 2224/81127* (2013.01); *H01L 2224/81204* (2013.01); *H01L 2224/81801* (2013.01); *H01L 2224/8385* (2013.01); *H01L 2224/83127* (2013.01); *H01L 2224/83204* (2013.01); *H01L 2224/92125* (2013.01)

(56) References Cited

U.S. PATENT DOCUMENTS

2004/0217100 A1* 11/2004 Ogimoto ............. B23K 20/023 219/243
2007/0170140 A1* 7/2007 Gaunekar ............. B23Q 1/012 212/312
2008/0227239 A1* 9/2008 Shibata ............. H01L 21/67132 438/110
2009/0218964 A1* 9/2009 Motegi ............. G03F 7/70758 318/135
2012/0043005 A1 2/2012 Yamakami et al.
2012/0117796 A1* 5/2012 Kim ................... H05K 13/0413 29/832
2013/0340943 A1* 12/2013 Yoshida ................. H01L 24/74 156/380.9

FOREIGN PATENT DOCUMENTS

| | | |
|---|---|---|
| JP | 2012248778 A | 12/2012 |
| KR | 100785507 B1 | 12/2007 |
| KR | 100969531 B1 | 7/2010 |
| KR | 20110137602 A | 12/2011 |
| KR | 20120046431 A | 5/2012 |
| KR | 20120080787 A | 7/2012 |
| KR | 101217505 B1 | 8/2012 |
| KR | 20120092949 A | 8/2012 |

* cited by examiner

SEMICONDUCTOR MANUFACTURING APPARATUSES COMPRISING BONDING HEADS

CROSS-REFERENCE TO RELATED APPLICATION(S)

This application claims priority from Korean Patent Application No. 10-2013-0147603, filed on Nov. 29, 2013, in the Korean Intellectual Property Office (KIPO), the entire contents of which are incorporated herein by reference.

BACKGROUND

1. Field

Some example embodiments of the present inventive concepts may relate to semiconductor manufacturing apparatuses. Some example embodiments of the present inventive concepts may relate to semiconductor manufacturing methods.

2. Description of Related Art

A semiconductor packaging process may include a sawing process for cutting and individualizing a wafer into semiconductor chips (or dies), a die bonding process for bonding an individualized semiconductor chip onto a circuit board, a wire bonding process for electrically connecting the semiconductor chip to connection pads of the circuit board, a molding process for molding the semiconductor chip and its peripheral portion, and/or a process for forming external connection terminals on a ball pad of the circuit board. In the case where contact-to-contact connection is made through wire bonding, bonding accuracy of several tens of micrometers is sufficient for such connection. However, in the case of bonding of a flip chip or a through-silicon-via chip in which contacts come in direct connection with each other, high bonding accuracy of several micrometers is required.

Korean Patent Publication No. 2011-0137602 discloses a bond head of a die bonding apparatus.

SUMMARY

Some example embodiments of the present inventive concepts may provide semiconductor manufacturing apparatuses that may minimize heat distortion and/or heighten precision.

Some example embodiments of the present inventive concepts may provide methods for manufacturing semiconductors that may minimize heat distortion and/or heighten precision.

Some example embodiments of by the present inventive concepts may provide methods for manufacturing semiconductors that may heighten cooling efficiency.

In some example embodiments, a semiconductor manufacturing apparatus may comprise: a pickup unit configured to pick up a chip in a first region of the semiconductor manufacturing apparatus; a bonding head configured to receive the picked-up chip and configured to move from the first region to a top of a circuit board in a second region of the semiconductor manufacturing apparatus; and/or an optical unit configured to detect a bonding position on the circuit board while moving from the first region to the second region.

In some example embodiments, the optical unit may be on an upper portion of the circuit board while the bonding head moves from the first region to the second region.

In some example embodiments, the bonding head may bond the chip at the detected bonding position after the bonding head reaches the second region.

In some example embodiments, the semiconductor manufacturing apparatus may further comprise a gantry frame having a hollow therein. The bonding head may be configured to move in the hollow. The bonding head may be configured to move from the first region to the second region along the gantry frame.

In some example embodiments, the bonding head and the optical unit may be on a same axis-line along a length direction of the gantry frame.

In some example embodiments, the semiconductor manufacturing apparatus may further comprise: a driving motor configured to move the bonding head; and/or a scale configured to indicate a movement position of the bonding head. The driving motor and the scale may be on opposite sides of the bonding head.

In some example embodiments, a method for manufacturing a semiconductor may comprise: picking up a chip in a first region of a semiconductor manufacturing apparatus; supplying the picked-up chip to a bonding head; and/or moving the bonding head from the first region to a circuit board in a second region of the semiconductor manufacturing apparatus. A bonding position on the circuit board may be detected while the bonding head moves from the first region to the second region.

In some example embodiments, the method may further comprise: bonding the chip at the detected bonding position after the bonding head reaches the second region.

In some example embodiments, the bonding head may be configured to move from the first region to the second region along a gantry frame.

In some example embodiments, a semiconductor manufacturing apparatus may comprise: a bonding head including a heater for heating a chip and bonding the chip onto a circuit board; and/or a cooling block, adjacent to the heater, through which cooling liquid flows. The cooling liquid may be removed from the cooling block while the heater generates heat. The cooling liquid may be supplied to the cooling block while the heater is cooled.

In some example embodiments, the semiconductor manufacturing apparatus may further comprise: a cooling device configured to supply the cooling liquid to the cooling block; and/or a valve between the cooling device and the cooling block. The valve may be closed while the heater generates heat. The valve may be open while the heater is cooled.

In some example embodiments, the semiconductor manufacturing apparatus may further comprise: a purge unit between the valve and the cooling block. The purge unit may be configured to remove the cooling liquid from the cooling block while the heater generates heat.

In some example embodiments, the cooling liquid supplied to the cooling block returns to the cooling device and is re-cooled by the cooling device.

In some example embodiments, the bonding head may comprise a first bonding head and a second bonding head. The first bonding head may bond the chip at the bonding position by heating the chip while the second bonding head is cooled.

In some example embodiments, a method for manufacturing a semiconductor may comprise: picking up and attaching a chip in a first region of a semiconductor manufacturing apparatus to a bonding head at a first temperature; moving the bonding head from the first region to a top of a circuit board in a second region of the semiconductor manufacturing apparatus; bonding the chip at a bonding position on the circuit board at a second temperature that is higher than the first temperature; and/or cooling the bonding head down to a third temperature that is higher than the first temperature and is lower than the second temperature. The bonding position may be detected while the bonding head moves from the first region to the second region.

In some example embodiments, the bonding head may include a first bonding head and a second bonding head. The bonding position may include a first bonding position and a second bonding position. The method may further comprise: picking up and attaching a first chip in the first region to the first bonding head at the first temperature; moving the first bonding head from the first region to the top of the circuit board in the second region; bonding the first chip at the first bonding position on the circuit board at the second temperature; and/or cooling the first bonding head down to the third temperature. The first bonding head may be cooled from the third temperature to the first temperature while the second bonding head picks up a second chip in the first region and bonds the second chip at the second bonding position of the circuit board in the second region.

In some example embodiments, the first bonding position may be detected while the first bonding head moves from the first region to the second region. The second bonding position may be detected while the second bonding head moves from the first region to the second region.

In some example embodiments, a semiconductor manufacturing apparatus may comprise: a first unit configured to pick up at least one chip in a first region of the semiconductor manufacturing apparatus; a second unit configured to receive the at least one chip and configured to move from the first region to a top of a circuit board in a second region of the semiconductor manufacturing apparatus; and/or a third unit configured to detect a bonding position on the circuit board.

In some example embodiments, the third unit may be further configured to detect the bonding position on the circuit board while the second unit moves from the first region to the second region.

In some example embodiments, the third unit may be further configured to detect the bonding position on the circuit board while the third unit moves from the first region to the second region.

In some example embodiments, the semiconductor manufacturing apparatus may further comprise a gantry frame. The second unit may be further configured to move from the first region to the second region along the gantry frame.

In some example embodiments, the second unit may be further configured to be heated and cooled.

In some example embodiments, the second unit may be further configured to be cooled using a cooling block through which cooling liquid flows.

In some example embodiments, the second unit may comprise a first portion and a second portion.

In some example embodiments, the first portion may be configured to be heated and cooled.

In some example embodiments, the first portion may be configured to be heated and cooled. The second portion may be configured to be heated and cooled.

In some example embodiments, the first portion may be configured to be cooled while the second portion is heated. The second portion may be configured to be cooled while the first portion is heated.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
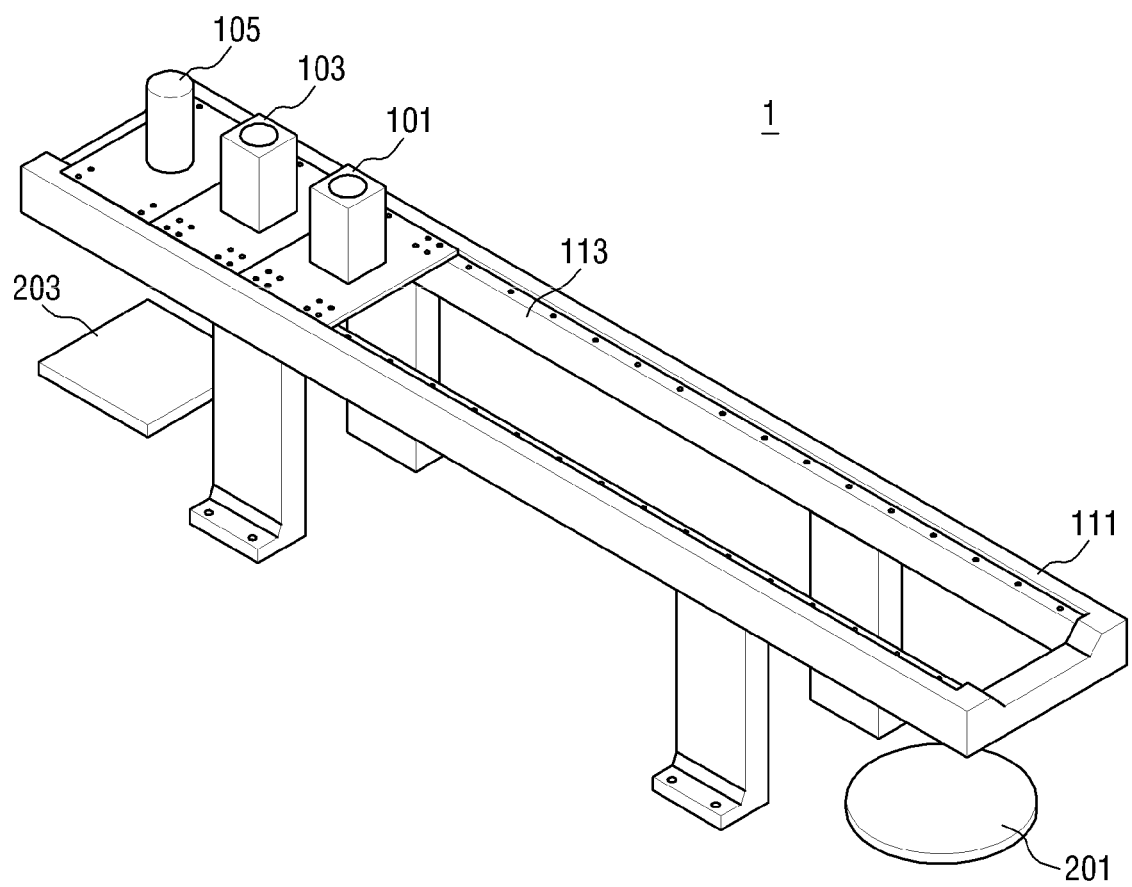
FIG. 1 is a schematic view illustrating a semiconductor manufacturing apparatus according to some example embodiments of the present inventive concepts.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a schematic view illustrating a semiconductor manufacturing apparatus according to some example embodiments of the present inventive concepts.

Figure 3A:
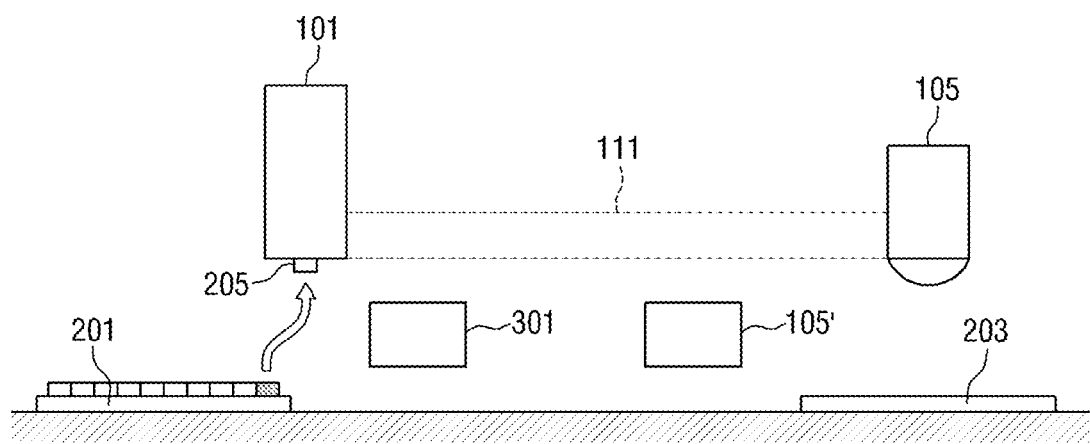
FIGS. 3A to 3C are views explaining a second operation example of a semiconductor manufacturing apparatus according to some example embodiments of the present inventive concepts.

Referring to FIGS. 1 and 3A, a semiconductor manufacturing apparatus according to some example embodiments of the present inventive concepts may include bonding heads 101 and 103, an optical unit 105, and a pickup unit 301.

The bonding heads 101 and 103 are devices which receive a chip 205 that is separated from a wafer 201 and bond the received chip 205 onto a circuit board 203. A semiconductor manufacturing apparatus 1 according to some example embodiments of the present inventive concepts includes two bonding heads 101 and 103 that are arranged in a line on a gantry frame 111. However, the number of bonding heads is not limited to two, and a single bonding head 101 may be provided. The bonding heads 101 and 103 may perform horizontal movement and vertical movement. In some example embodiments, the bonding heads 101 and 103 may move between the wafer 201 and the circuit board 203 along the gantry frame 111, or may perform vertical movement to bond the chip 205 onto the circuit board 203.

The optical unit 105 detects a bonding position at which the chip 205 is bonded onto the circuit board 203. In the semiconductor manufacturing apparatus 1 according to some example embodiments of the present inventive concepts, the optical unit 105 is arranged in parallel to the bonding heads 101 and 103 on the gantry frame 111, and may make horizontal movement along the gantry frame 111. If the optical unit 105 moves above the circuit board 203 and detects the position at which the chip 205 is to be bonded onto the circuit board 203, such bonding position information is transferred to the bonding heads 101 and 103 to enable the bonding heads 101 and 103 to bond the chip 205 at an accurate bonding position when the bonding heads 101 and 103 arrive on the top of the circuit board 203. In some example embodiments of the present inventive concepts, the semiconductor manufacturing apparatus 1 may further include a lower optical unit 105'. The lower optical unit 105' provides state information of the moving chip 205 which is attached to the bonding heads 101 and 103 to the optical unit 105, and enables the optical unit 105 to accurately detect the bonding position.

The pickup unit 301 selects the chip 205 that is in an electrically preferable state from the wafer 201, and picks up and supplies the selected chip 205 to the bonding heads 101 and 103. In the semiconductor manufacturing apparatus 1 according to some example embodiments of the present inventive concepts, the pickup unit 301 picks up and flips the selected chip 205 from the wafer 201, and directly attaches the chip 205 to the bonding heads 101 and 103 that are positioned on an upper portion of the wafer 201 without the necessity of transferring the chip 205 up to the bonding head 101 and 103.

On the other hand, in the semiconductor manufacturing apparatus 1 according to some example embodiments of the present inventive concepts, the gantry frame 111 may include a hollow 117 formed therein, and the bonding heads 101 and 103 and the optical unit 105 may be fixed to be movable in the hollow 117. Further, in the semiconductor manufacturing apparatus 1 according to some example embodiments of the present inventive concepts, the gantry frame 111 may be made of a material having high stiffness and heat resistance, for example, a material that includes a ceramic material.

Figure 2A:
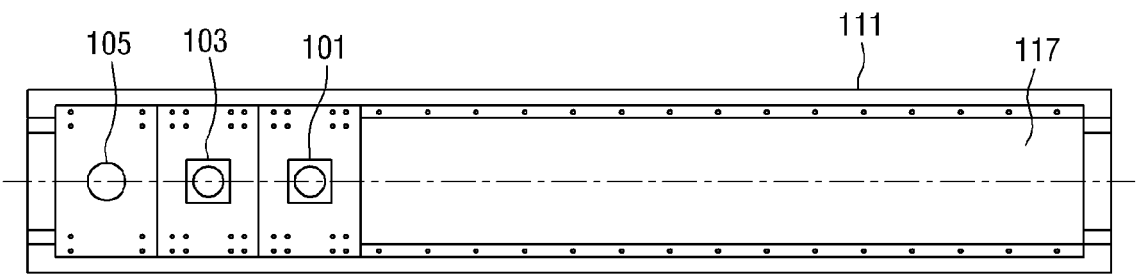
FIGS. 2A and 2B are views explaining a first operation example of a semiconductor manufacturing apparatus according to some example embodiments of the present inventive concepts.
Figure 2B:
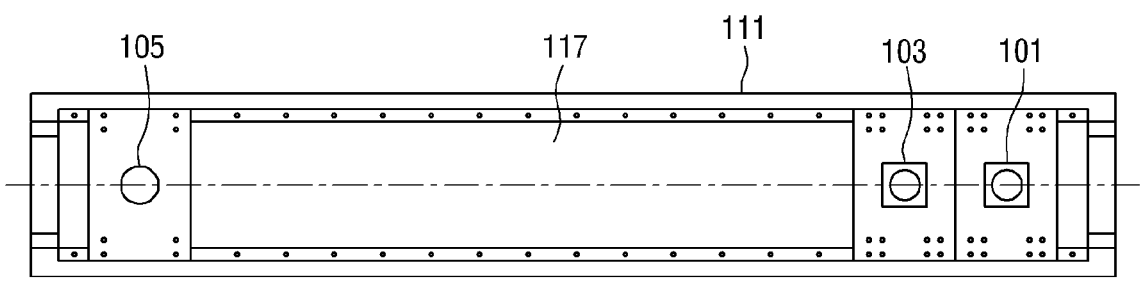

FIGS. 2A and 2B are views explaining a first operation example of a semiconductor manufacturing apparatus according to some example embodiments of the present inventive concepts.

Referring to FIG. 2A, the bonding heads 101 and 103 and the optical unit 105 may all be arranged on the gantry frame 111. In the semiconductor manufacturing apparatus 1 according to some example embodiments of the present inventive concepts, the bonding heads 101 and 103 and the optical unit 105 may be arranged on the same axis line that follows the length direction of the gantry frame 111. As described above, by arranging the bonding heads 101 and 103 and the optical unit 105 on the same axis line, a mechanical error between the bonding heads 101 and 103 and the optical unit 105 can be minimized. As illustrated in FIG. 2B, the bonding heads 101 and 103 and the optical unit 105 that are arranged on the gantry frame 111 may perform horizontal movement between the wafer 201 and the circuit board 203 along the gantry frame 111.

Figure 3B:
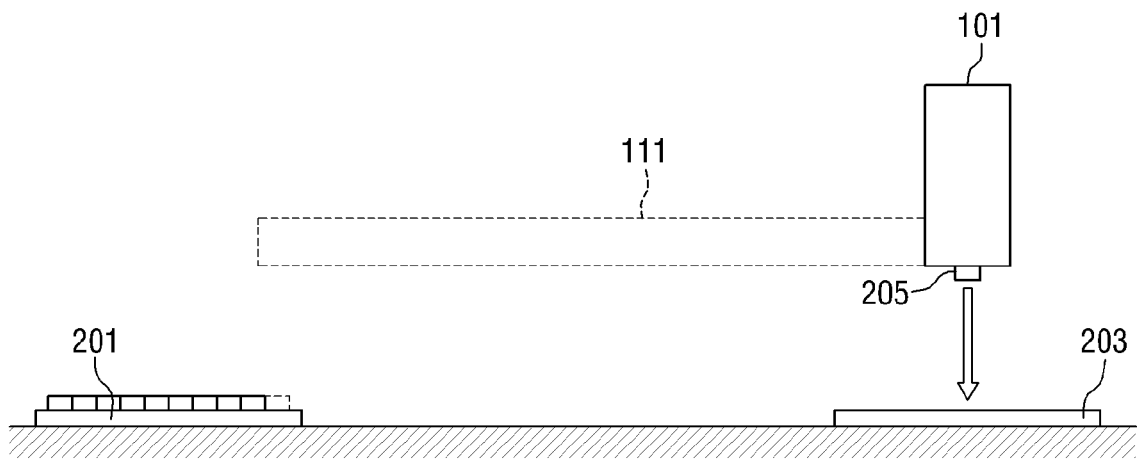
Figure 3C:
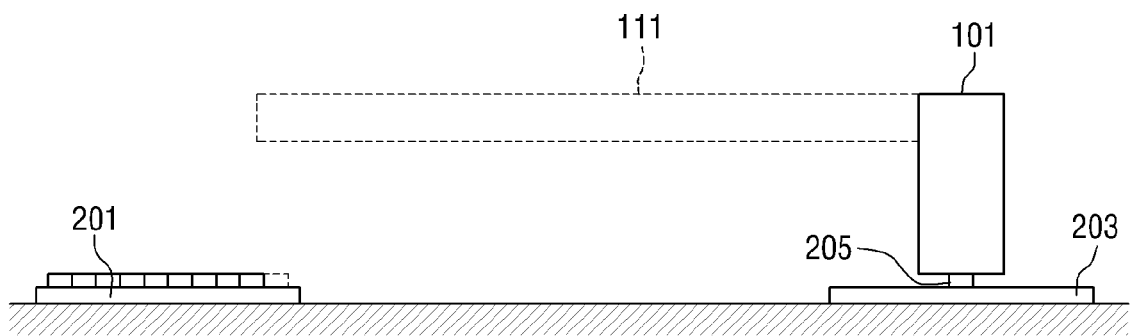

FIGS. 3A to 3C are views explaining a second operation example of a semiconductor manufacturing apparatus according to some example embodiments of the present inventive concepts. Referring to FIGS. 3A to 3C, in the semiconductor manufacturing apparatus 1 according to some example embodiments of the present inventive concepts, the bonding head 101 and the optical unit 105 perform bonding work of the chip 205 between a region where the wafer 201 is provided (hereinafter referred to as a "first region") and a region where the circuit board 203, on which bonding of the chip 205 is performed, is provided (hereinafter referred to as a "second region").

In some example embodiments, referring to FIG. 3A, the bonding head 101 for receiving a supply of the chip 205 performs horizontal movement to an upper portion of the first region along the gantry frame 111. Next, the pickup unit 301 picks up at least one chip 205 that is arranged in the first region and supplies the picked chip 205 to the bonding head 101. By moving the bonding head 101 to the upper portion of the first region before the pickup unit 301 picks up the chip 205, the pickup unit 301 can directly attach the chip 205 to the bonding head 101 that is in a standby state on the upper portion of the first region without the necessity of separately transferring the picked chip 205. Through this method, time for transferring the chip 205 can be shortened.

On the other hand, the optical unit 105, which is to detect the bonding position of the circuit board 203, may be positioned on an upper portion of the second region while the above-described process is performed. While the bonding head 101, to which the chip 205 is attached, moves from the first region to the second region, the optical unit 105 may detect the bonding position on the circuit board 203. In some example embodiments of the present inventive concepts, while the bonding head 101, to which the chip 205 is attached, moves from the first region to the second region, the lower optical unit 105' detects the state information of the chip 205, which is attached to the bonding head 101 to move, and provides the state information to the optical unit 105 to enable the optical unit 105 to accurately detect the bonding position. In the semiconductor manufacturing apparatus 1 according to some example embodiments of the present inventive concepts, a flying-vision-type optical unit 105, which detects the bonding position as looking down the circuit board 203 from an upper position, is used, and thus heat distortion can be minimized as compared with the optical system of a simultaneous upper/lower identification structure in the related art.

Referring to FIG. 3B, the bonding head 101, to which the chip 205 is attached, moves to the upper portion of the detected bonding position as moving from the first region to the second region. Since the optical unit 105 detects the bonding position while the bonding head 101 moves from the first region to the second region, the bonding head 101 that has reached the second region can directly bond the chip 205 at the detected bonding position without the necessity of performing additional work. Accordingly, the bonding time can be shortened, and the productivity can be improved. Next, referring to FIG. 3C, the bonding head 101 can perform vertical movement toward the circuit board 203 to bond the chip 205, and after arranging the chip 205 at the bonding position of the circuit board 203, the bonding head 101 bonds the chip 205 through application of heat and force thereto. As described above, in order to bond the chip 205, the bonding head 101 should be heated, and the heated bonding head 101 is required to be cooled to perform the next bonding work.

Figure 4A:
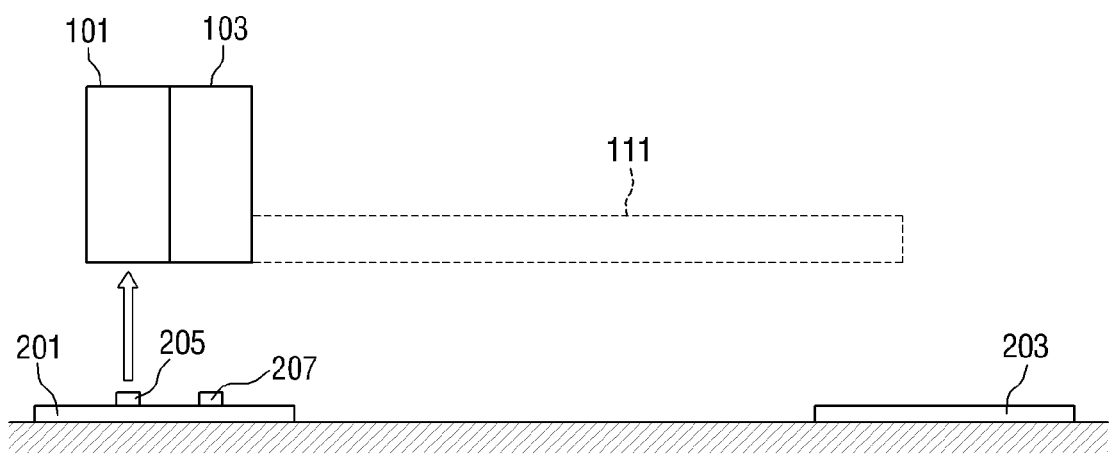
FIGS. 4A to 4H are views explaining a third operation example of a semiconductor manufacturing apparatus according to some example embodiments of the present inventive concepts.
Figure 4B:
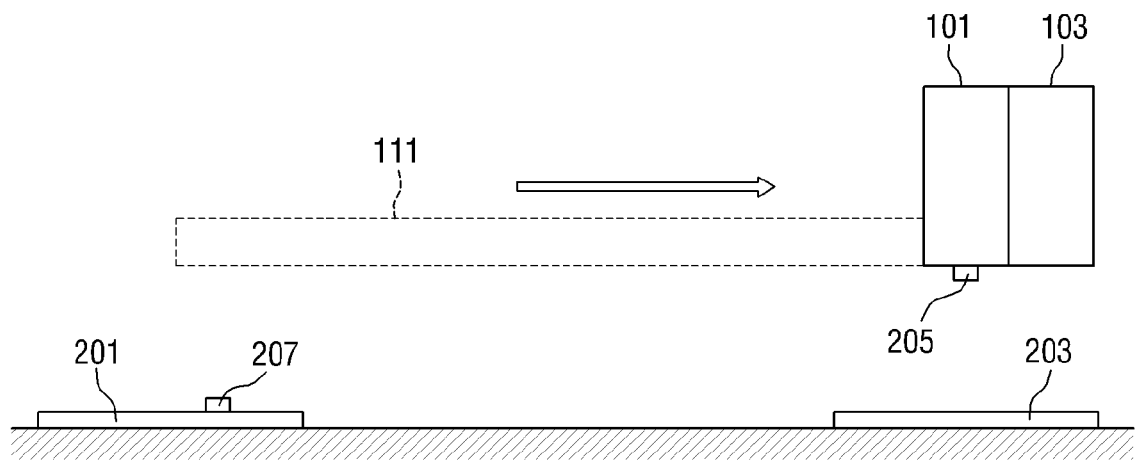
Figure 4C:
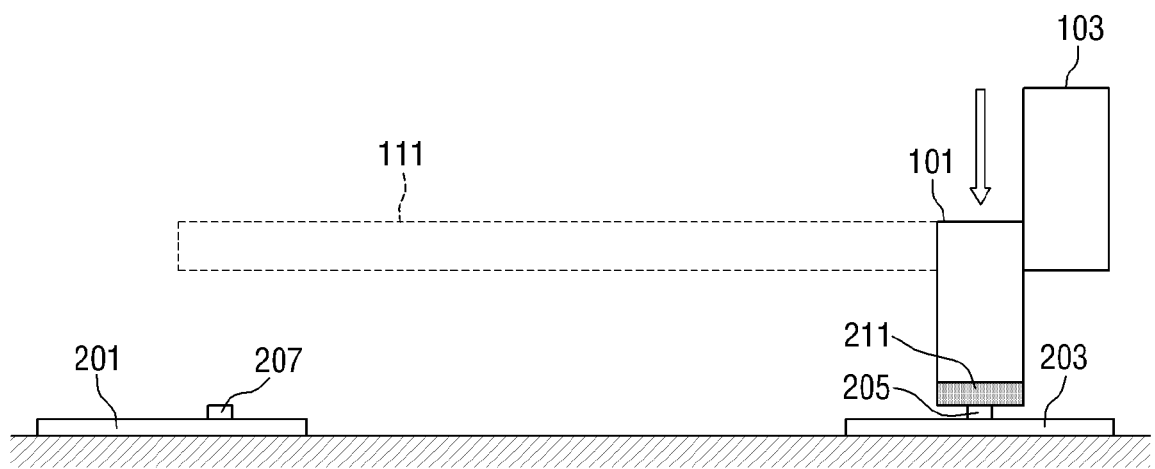

FIGS. 4A to 4H are views explaining a third operation example of a semiconductor manufacturing apparatus according to some example embodiments of the present inventive concepts. Referring to FIGS. 4A to 4C, the bonding heads 101 and 103 of the semiconductor manufacturing apparatus 1 according to some example embodiments of the present inventive concepts alternately perform the bonding work between the first region and the second region.

In some example embodiments, referring to FIG. 4A, the bonding heads 101 and 103 perform horizontal movement to the upper portion of the first region along the gantry frame 111. Next, the pickup unit 301 picks up at least one chip 205 that is arranged in the first region and supplies the picked chip 205 to the bonding head 101. While the above-described process is performed, the optical unit 105 for detecting the bonding position of the circuit board 203 may be positioned on the upper portion of the second region, and while the bonding heads 101 and 103 move from the first region to the second region, the optical unit 105 may detect the bonding position on the circuit board 203.

Referring to FIG. 4B, the bonding heads 101 and 103 move to the upper portion of the detected bonding position as moving from the first region to the second region. Since the optical unit 105 detects the bonding position while the bonding heads 101 and 103 move from the first region to the second region, the bonding head 101 with the attached chip 205, which has reached the second region, can directly bond the chip 205 at the detected bonding position without the necessity of performing additional work.

Referring to FIG. 4C, the bonding head 101 can perform vertical movement toward the circuit board 203 to bond the chip 205, and after arranging the chip 205 at the bonding position of the circuit board 203, the bonding head 101 bonds the chip 205 through application of heat and force thereto. In the semiconductor manufacturing apparatus 1 according to some example embodiments of the present inventive concepts, in order to bond the chip 205, the bonding head 101 may include a heating region 211. In some example embodiments of the present inventive concepts, the heating region 211 may be formed by a heater provided inside the bonding head 101.

Figure 4D:
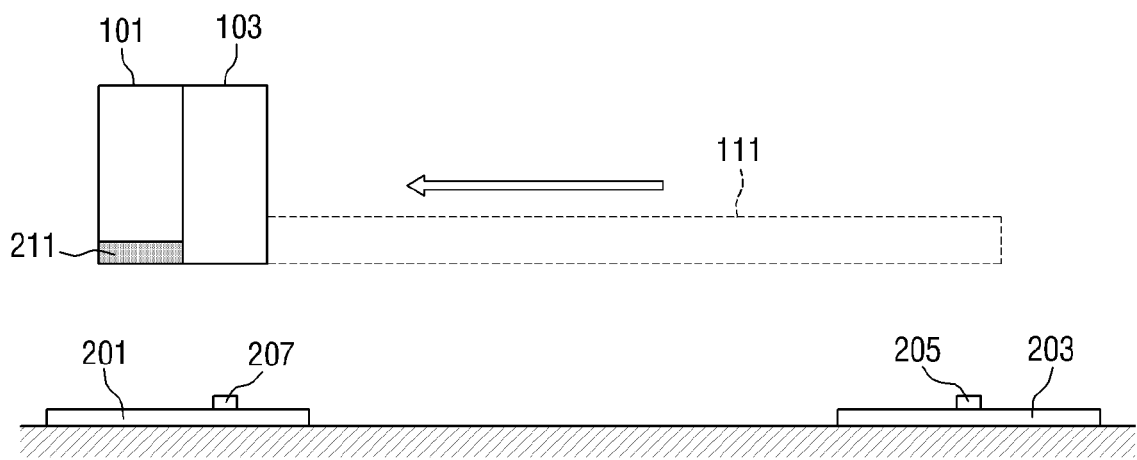

Next, referring to FIG. 4D, the bonding heads 101 and 103 perform horizontal movement from the second region to the upper portion of the first region along the gantry frame 111, and at this time, the heating region 211 of the bonding head 101 is cooled. However, it may be difficult for the heating region 211 to be completely cooled while the bonding heads 101 and 103 move from the second region to the upper portion of the first region. Accordingly, in order for the bonding head 101 to perform bonding of another chip 207 just after completion of the bonding work with respect to one chip 205, the bonding head 101 should wait until all the heating region 211 is cooled. In order to solve this problem, the semiconductor manufacturing apparatus 1 according to some example embodiments of the present inventive concepts is provided with two bonding heads 101 and 103. While one bonding head 101 performs the bonding work, the other bonding head 103 is cooled.

Figure 4E:
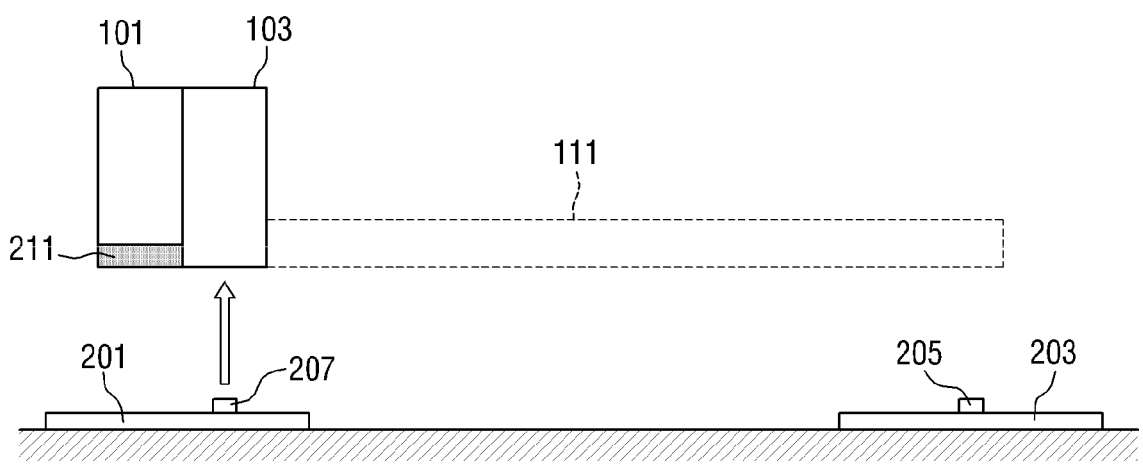
Figure 4F:
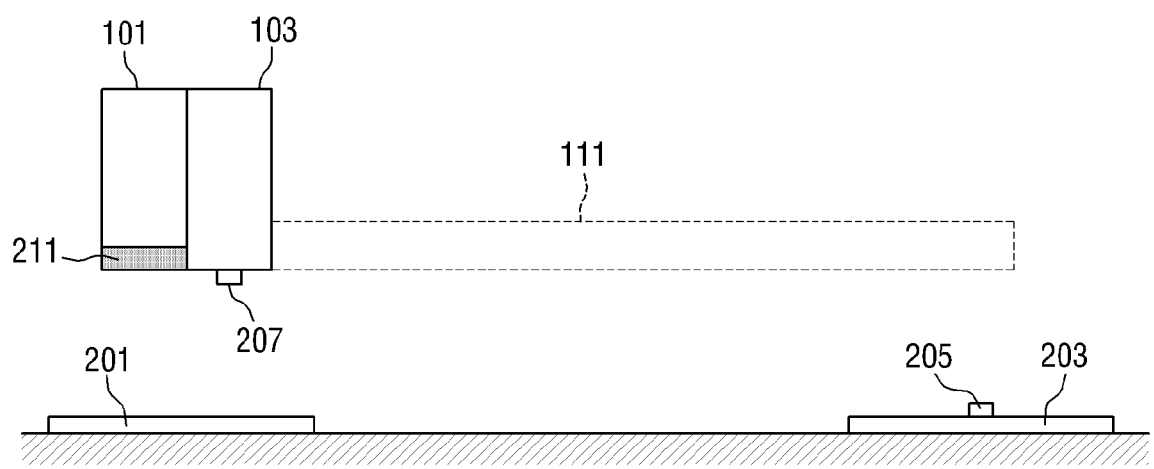
Figure 4G:
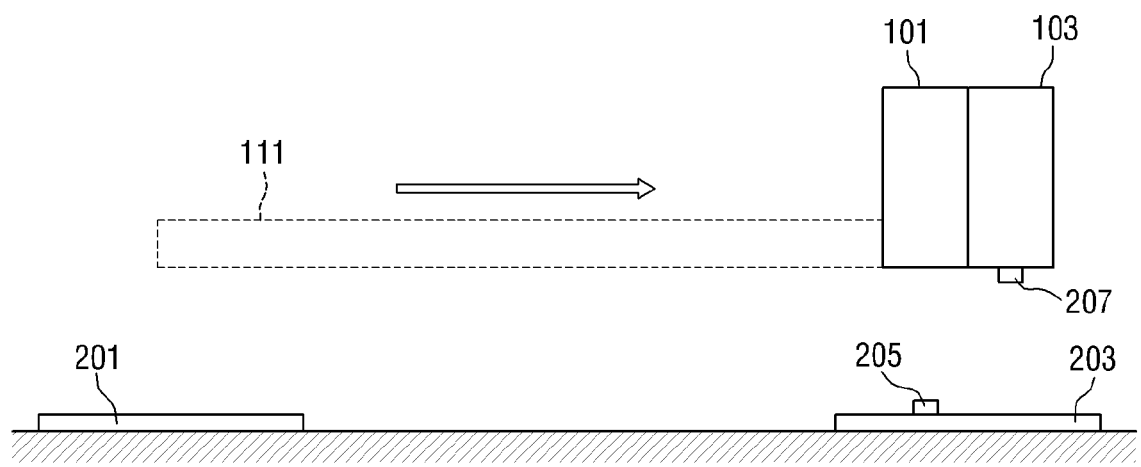
Figure 4H:
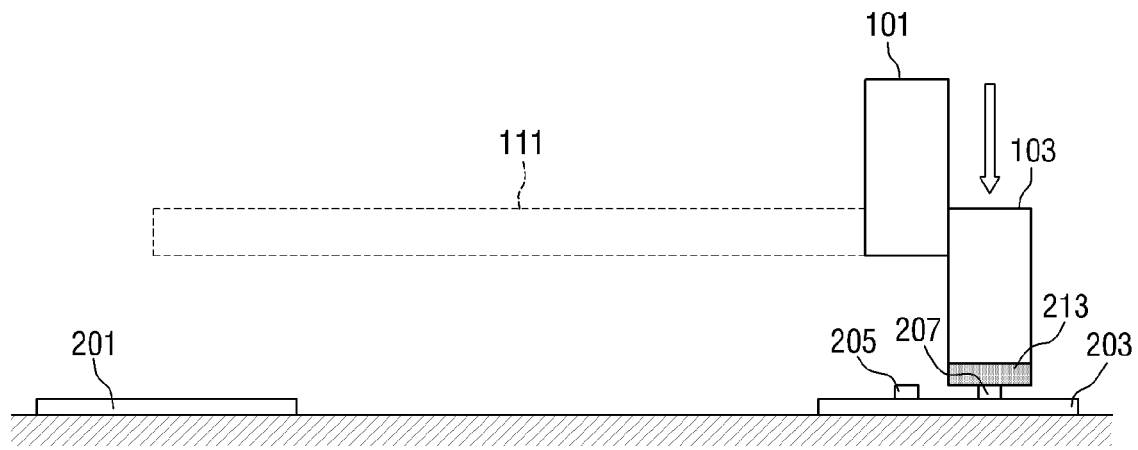

In some example embodiments, referring to FIGS. 4E to 4G, while the bonding head 101 is cooled, the bonding head 103 performs the bonding work with respect to the chip 207. That is, while the bonding head 101 is cooled, the pickup unit 301 picks up the chip 207 that is arranged in the first region, and supplies the picked chip 207 to the bonding head 103. In this case, the bonding head 103 moves to the upper portion of the bonding position that is detected by the optical unit 105 while the bonding heads 101 and 103 move from the first region to the second region. Next, referring to FIG. 4H, the bonding head 103 arranges the chip 207 in the bonding position of the circuit board 203, and then bonds the chip 207 by applying heat and force thereto. In this process, a heating region 213 is created in the lower portion of the bonding head 103.

Thereafter, in the same manner as described above, the bonding head 101 performs bonding of a new chip while the bonding head 103 is cooled. As described above, since the two bonding heads 101 and 103 alternately perform the bonding work, a delay that may occur between the bonding works can be effectively prevented.

Figure 5A:
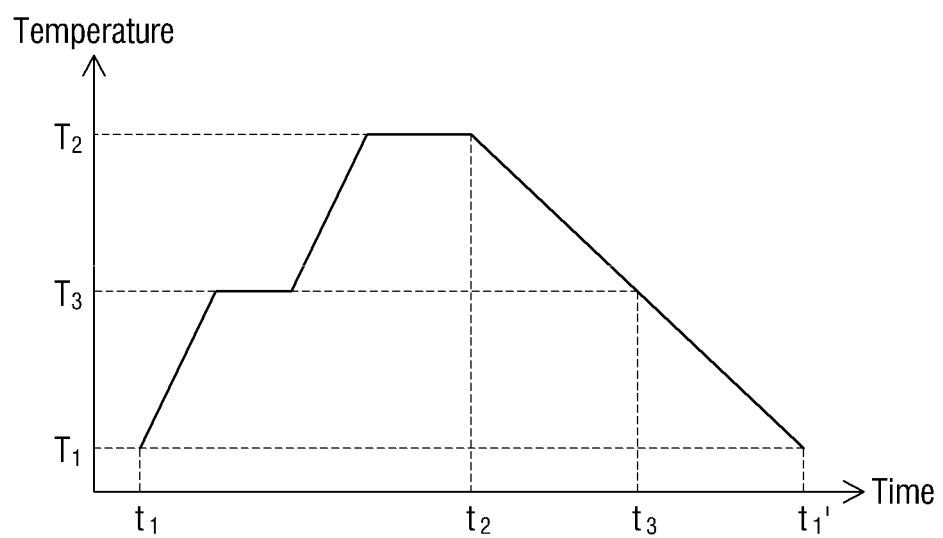
FIG. 5A is a graph illustrating a temperature change of a bonding head in a bonding process.
Figure 5B:
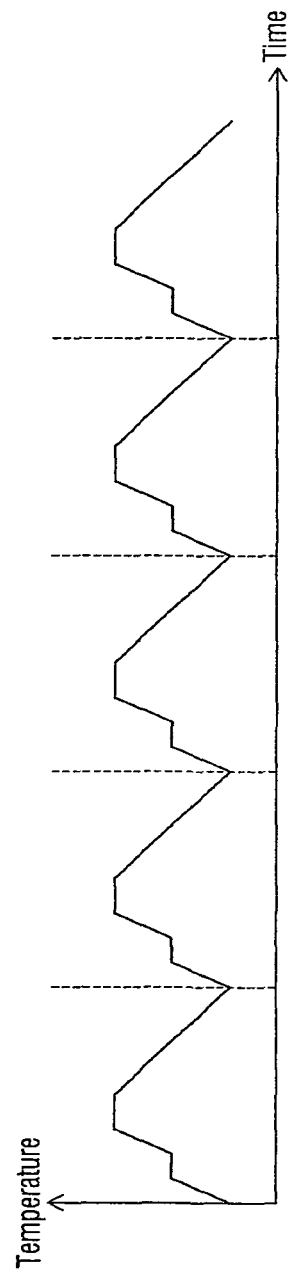
FIG. 5B is a graph illustrating a temperature change of a bonding head in a bonding process using a single bonding head.
Figure 5C:
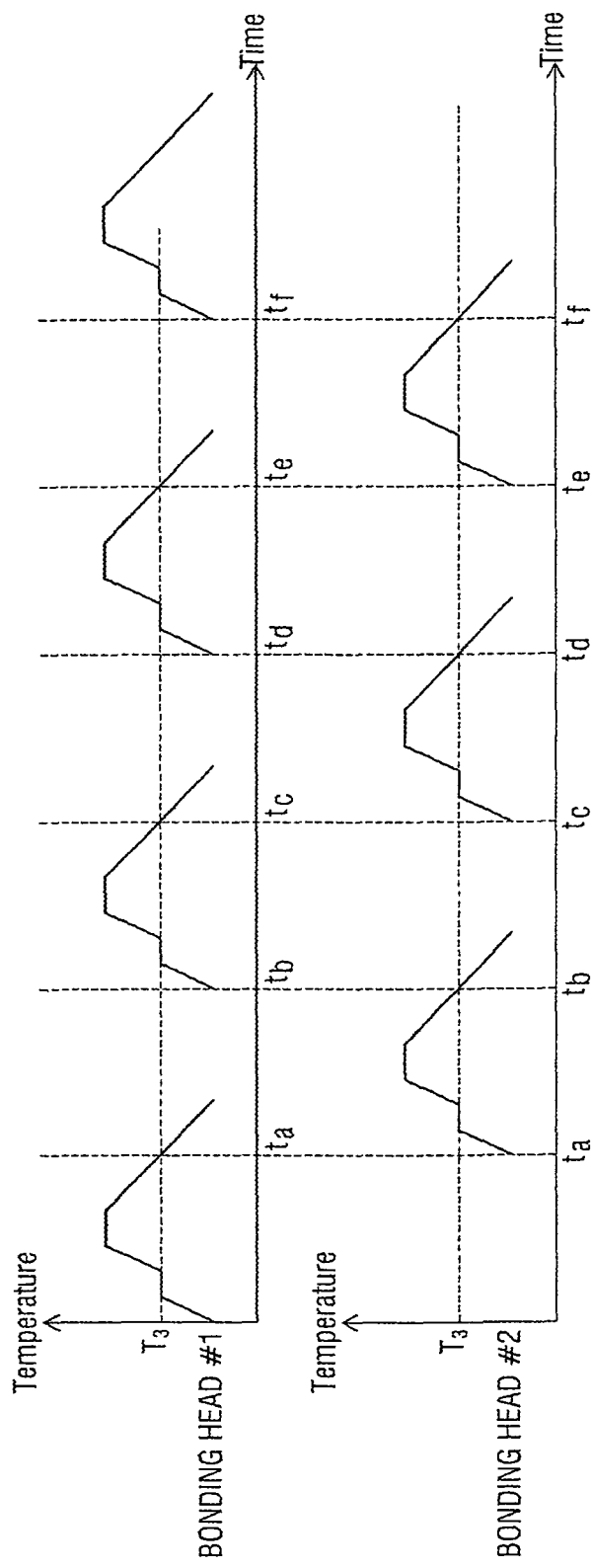
FIG. 5C is a graph illustrating a temperature change of bonding heads in a bonding process using two bonding head.

FIG. 5A is a graph illustrating a temperature change of a bonding head in a bonding process, FIG. 5B is a graph illustrating a temperature change of a bonding head in a bonding process using a single bonding head, and FIG. 5C is a graph illustrating a temperature change of bonding heads in a bonding process using two bonding heads.

Referring to FIG. 5A, the graph illustrates the temperature change of the bonding heads 101 and 103 while one chip 205 is bonded. In the graph, x-axis represents time for performing the bonding work, and y-axis represents temperature of the bonding heads 101 and 103 in accordance with the work time. A period from a time $t_1$ to a time $t_1'$ indicates a required time for a unit work to bond one chip 205.

In some example embodiments, the temperature of the bonding heads 101 and 103 at the time $t_1$ when the unit work starts is a temperature $T_1$. Further, if the bonding heads 101 and 103 reach the bonding position and bond the chip 205, the temperature of the bonding heads 101 and 103 is increased up to a temperature $T_2$. In the graph, a time $t_2$ indicates the time when the bonding of the chip 205 on the circuit board 203 is completed. In some example embodiments of the present inventive concepts, a temperature increasing period of the bonding heads 101 and 103 may include two periods having constant temperatures. For example, the first period having the constant temperature may correspond to a period in which non-conductive film (NCF) melting is performed, and the second period having the constant temperature may correspond to a period in which metal joining is performed. Thereafter, the temperature of the bonding heads 101 and 103 that have completed the bonding is decreased again to the temperature $T_1$, and in the case of using a single bonding head, a new bonding work may start at the time $t_1'$. FIG. 5B illustrates the temperature of the bonding head in the case where five chips are successively bonded using a single bonding head.

Referring to FIG. 5C, the graph illustrates the temperature change of the bonding heads 101 and 103 during the chip bonding process. As described above with reference to FIGS. 4A to 4H, in the semiconductor manufacturing apparatus 1 according to some example embodiments of the present inventive concepts, the bonding heads 101 and 103 may alternately perform the bonding of the chip 205 between the first region and the second region. Referring to FIG. 5A, a time $t_3$ illustrated in FIG. 5A indicates a time when the bonding head 101, which has finished the chip bonding process, moves from the second region to the first region as being cooled. That is, at the time $t_3$, the bonding head 101 is in a state of a temperature $T_3$, and thus is unable to immediately perform the next bonding process. However, the other bonding head 103 can immediately start the next bonding process at the time $t_3$. Accordingly, without the necessity of completely cooling the bonding head 101, the bonding head 103 can immediately start the next bonding process at the time $t_3$. In FIG. 5C, in the same manner as the time $t_3$ in FIG. 5A, a time $t_a$, a time $t_b$, a time $t_c$, a time $t_d$, a time $t_e$, and a time $t_f$ indicate time points when the other bonding head 103 can start the bonding work while the bonding head 101 is cooled. As described above, since the two bonding heads 101 and 103 alternately perform the bonding work, a delay that may occur between the bonding works can be effectively prevented, and as can be known from FIGS. 5B and 5C, the productivity can be improved.

Figure 6:
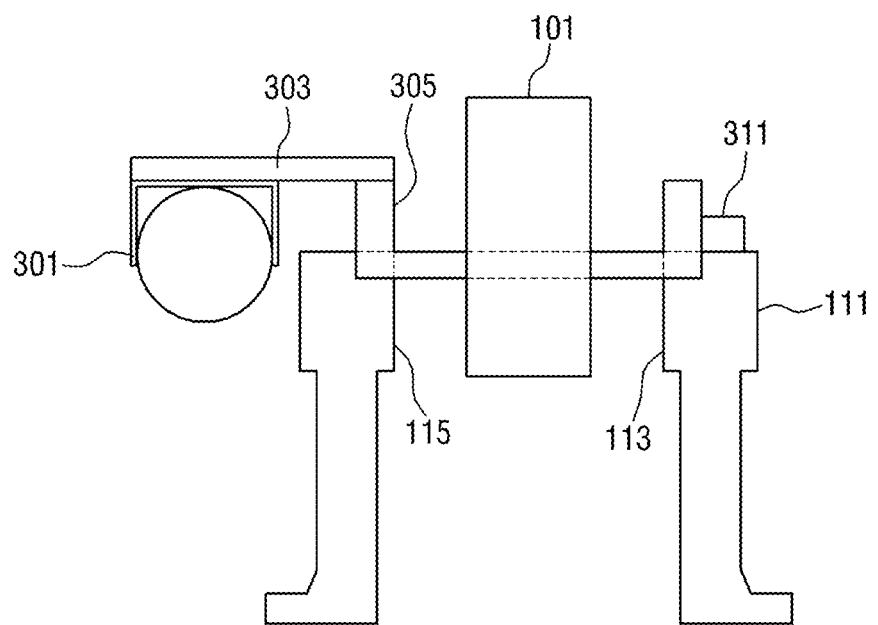
FIG. 6 is a view illustrating a bonding head support structure used in a semiconductor manufacturing apparatus according to some example embodiments of the present inventive concepts.

FIG. 6 is a view illustrating a bonding head support structure used in a semiconductor manufacturing apparatus according to some example embodiments of the present inventive concepts.

Referring to FIG. 6, the bonding head 101 that is used in the semiconductor manufacturing apparatus 1 according to some example embodiments of the present inventive concepts may be supported inside the hollow 117 of the gantry frame 111. In some example embodiments, the bonding head 101 is supported by both surfaces, that is, a first frame surface 113 and a second frame surface 115, of the gantry frame 111, and thus distortion of the semiconductor manufacturing apparatus or the board due to the bonding force can be minimized. On the other hand, the semiconductor manufacturing apparatus 1 according to some example embodiments of the present inventive concepts may further include a driving motor 303 moving the bonding head 101, and a scale 311 indicating a movement position of the bonding head 101. In some example embodiments, the driving motor 303 and the scale 311 are arranged on opposite sides about the bonding head 101, and thus the distortion of the semiconductor manufacturing apparatus or the board due to the heat generated from the driving motor 303 can be minimized. In some example embodiments of the present inventive concepts, a driving motor connection portion 305 for connecting the driving motor 303 to the gantry frame 111 may be made of a material having low heat distortion, such as CFRP (Carbon Fiber Reinforced Plastics), to intercept the heat generated from the driving motor 303 more effectively.

Figure 7:
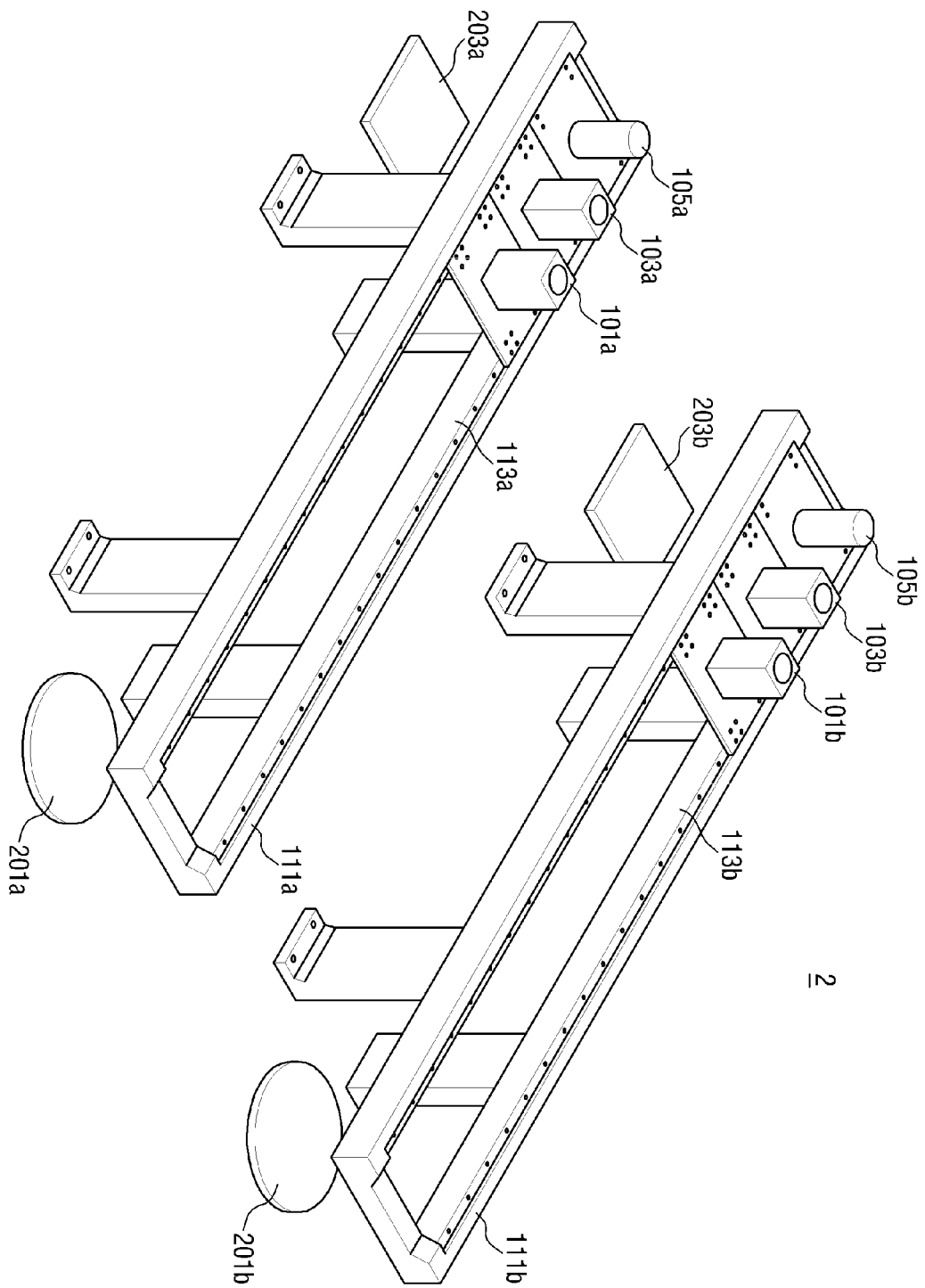
FIG. 7 is a view illustrating a semiconductor manufacturing apparatus according to some example embodiments of the present inventive concepts.

FIG. 7 is a view illustrating a semiconductor manufacturing apparatus according to some example embodiments of the present inventive concepts.

Referring to FIG. 7, a semiconductor manufacturing apparatus 2 according to some example embodiments of the present inventive concepts may include bonding heads 101a, 103a, 101b, and 103b provided in a pair of gantry frames 111a and 111b, and optical units 105a and 105b. Gantry frame 111a may have first frame surface 113a and gantry frame 111b may have first frame surface 113b. The two gantry frames 111a and 111b are configured in parallel, and wafers 201a and 201b and circuit boards 203a and 203b are provided on the respective gantry frames 111a and 111b to further heighten the productivity of the chip bonding work.

Figure 8:
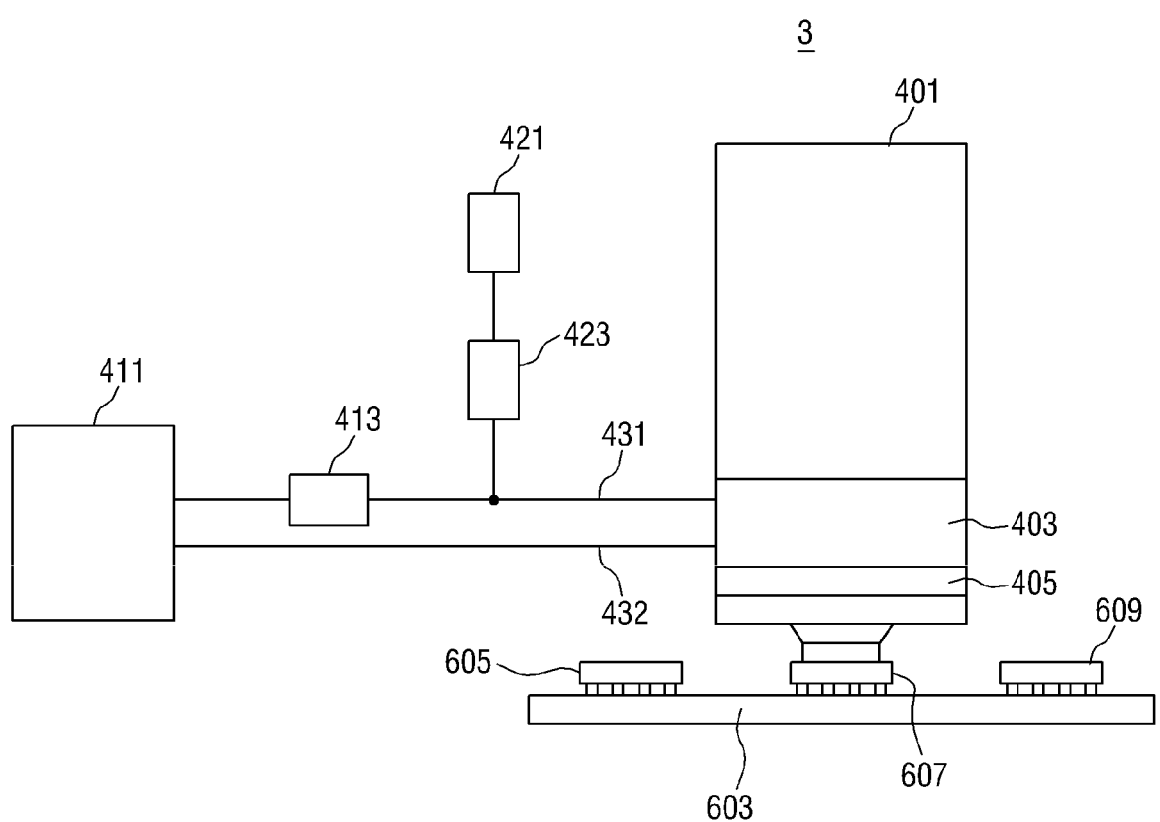
FIG. 8 is a schematic view illustrating a semiconductor manufacturing apparatus according to some example embodiments of the present inventive concepts.
Figure 9:
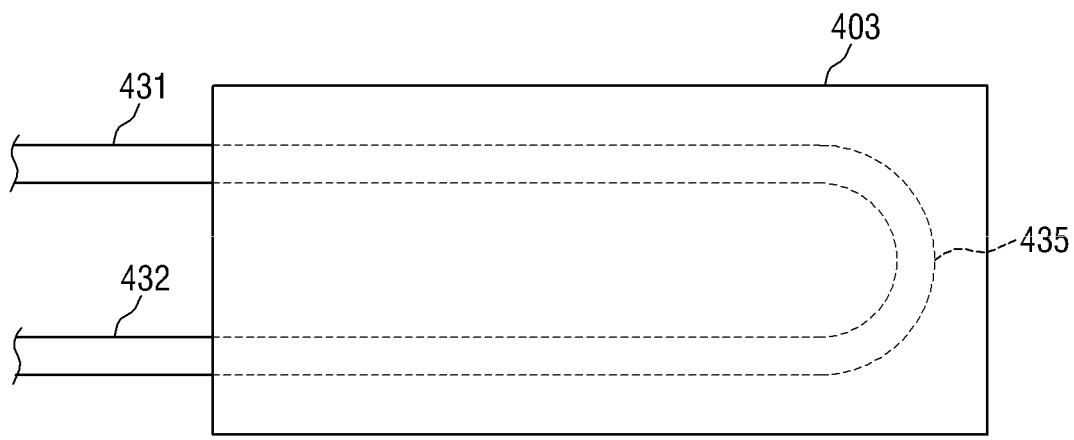
FIG. 9 is a view illustrating a cooling block that is used in a semiconductor manufacturing apparatus according to some example embodiments of the present inventive concepts.

FIG. 8 is a schematic view illustrating a semiconductor manufacturing apparatus according to some example embodiments of the present inventive concepts, and FIG. 9 is a view illustrating a cooling block that is used in a semiconductor manufacturing apparatus according to some example embodiments of the present inventive concepts.

Referring to FIG. 8, a semiconductor manufacturing apparatus 3 according to some example embodiments of the present inventive concepts includes a bonding head 401 and a cooling block 403.

In some example embodiments, the bonding head 401 includes a heater 405 that can heat chips 605, 607, and 609, and bonds the chips 605, 607, and 609 onto a circuit board 603. The cooling block 403 is formed adjacent to the heater 405, and cooling liquid may flow therein. In some example embodiments of the present inventive concepts, the cooling liquid may be water having high specific heat, but example embodiments of the present inventive concepts are not limited thereto. Referring to FIG. 9, the cooling block 403 may include an internal flow path 435 as a path through which cooling liquid flows.

The semiconductor manufacturing apparatus 3 according to some example embodiments of the present inventive concepts may further include a cooling device 411 supplying the cooling fluid to the cooling block 403, and a valve 413 formed between the cooling device 411 and the cooling block 403. The cooling device 411 and the cooling block 403 may be connected to each other through flow paths 431 and 432. Further, the semiconductor manufacturing apparatus 3 according to some example embodiments of the present inventive concepts may further include a purge unit 423 formed between the valve 413 and the cooling block 403 to remove the cooling liquid in the cooling block 403 while the heater 405 generates heat.

In the semiconductor manufacturing apparatus 3 according to some example embodiments of the present inventive concepts, the cooling liquid in the cooling block 403 is removed while the heater 405 generates heat, and the cooling liquid is supplied into the cooling block 403 while the heater 405 is cooled. For example, the valve 413 is closed while the heater 405 generates heat and is opened while the heater 405 is cooled, and thus supply of the cooling fluid to the cooling block 403 can be adjusted. Further, while the heater 405 generates heat, the purge unit 423 makes external air flow in through an external air inflow portion 421 to remove the cooling fluid in the cooling block 403. On the other hand, the cooling liquid supplied to the cooling block 403 may return to the cooling device 411 through the flow path 432, be cooled again by the cooling device 411, and then be supplied to the cooling block 403 through the flow path 431.

As described above, since the supply of the cooling liquid is limited when the temperature of the bonding head 401 is increased and the cooling liquid is supplied only when the bonding head 401 is cooled, it is prevented that pressure is applied to the semiconductor manufacturing apparatus 3 including the bonding head 401 due to gasification of the cooling liquid in the high-temperature process. Further, since water having high specific heat is used as the cooling liquid, the cooling efficiency can be heightened, and since the cooling liquid is circulated to be reused, particulate matter is prevented from occurring in the semiconductor manufacturing device 3, and thus the process cost can be saved.

Figure 10:
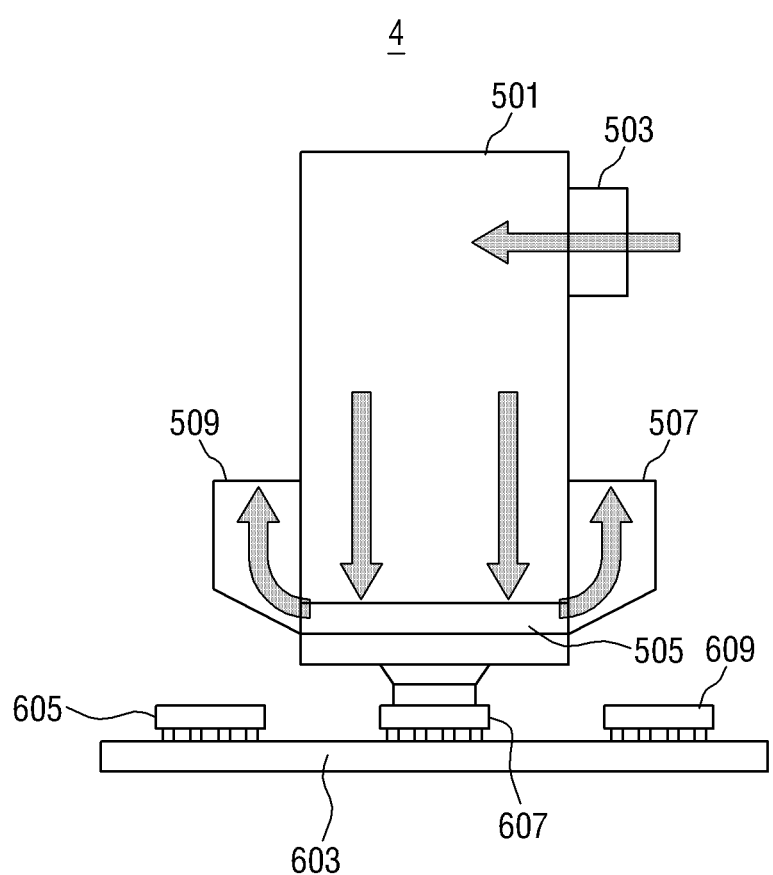
FIG. 10 is a schematic view illustrating a semiconductor manufacturing apparatus according to some example embodiments of the present inventive concepts.

FIG. 10 is a schematic view illustrating a semiconductor manufacturing apparatus according to some example embodiments of the present inventive concepts.

Referring to FIG. 10, a semiconductor manufacturing apparatus 4 according to some example embodiments of the present inventive concepts includes a bonding head 501, an air injection portion 503, and brackets 507 and 509.

In some example embodiments, the bonding head 501 includes a heater 505 that can heat chips 605, 607, and 609, and bonds the chips 605, 607, and 609 onto a circuit board 603. The air injection portion 503 supplies cooling gas to the heater 505, and the bonding head 501 includes an outlet for discharging the cooling gas out of the bonding head 501. The brackets 507 and 509 are formed on the outlet, and the discharge direction of the cooling gas is directed to the upper portion of the bonding head 501. In some example embodiments of the present inventive concepts, the outlet and the brackets 507 and 509 may be formed on a side surface of the bonding head 501, but example embodiments of the present inventive concepts are not limited thereto.

As described above, when the cooling gas for cooling the bonding head 501 is discharged out of the bonding head 501, the discharge direction is directed to the upper portion of the bonding head 501, and thus the circuit board 603 can be prevented from being polluted.

According to the semiconductor manufacturing apparatus and the method thereof according to some example embodiments of the present inventive concepts, the time required in the semiconductor chip bonding process can be shortened, and the productivity can be improved. Further, distortion of the semiconductor manufacturing apparatus and the circuit board due to the heat generated in the semiconductor chip bonding process can be minimized and the bonding precision can be heightened. Further, according to the semiconductor manufacturing apparatus and the method thereof according to some example embodiments of the present inventive concepts, not only the cooling efficiency is heightened and the pollution of the circuit board is prevented through suppression of the occurrence of the particulate matter but also the cost for the cooling process can be saved.

Although some example embodiments of the present inventive concepts have been described for illustrative purposes, those skilled in the art will appreciate that various modifications, additions and substitutions are possible, without departing from the scope and spirit of the inventive concepts as disclosed in the accompanying claims.

It should be understood that example embodiments described herein should be considered in a descriptive sense only and not for purposes of limitation. Descriptions of features or aspects within example embodiments should typically be considered as available for other similar features or aspects in other example embodiments.

What is claimed is:

1. A semiconductor manufacturing apparatus, comprising:
   a bonding head including a heater configured to heat a chip and bonding the chip onto a circuit board;
   a cooling block, adjacent to the heater, through which cooling liquid flows;
   a cooling device configured to supply the cooling liquid to the cooling block; and
   a valve between the cooling device and the cooling block;
   wherein the apparatus is configured to remove the cooling liquid from the cooling block while the heater generates heat,
   wherein the cooling device is further configured to supply the cooling liquid to the cooling block while the heater is cooled,
   wherein the valve is configured to be closed while the heater generates heat,
   wherein the valve is configured to be open while the heater is cooled, and
   wherein the apparatus is further configured to return to the cooling device, and to re-cool, the cooling liquid supplied to the cooling block.

2. A semiconductor manufacturing apparatus comprising:
a bonding head including a heater configured to heat a chip and bonding the chip onto a circuit board;
a cooling block, adjacent to the heater, through which cooling liquid flows; and
a cooling device configured to supply the cooling liquid to the cooling block;
wherein the cooling liquid is removed from the cooling block while the heater generates heat, and
wherein the cooling liquid is supplied to the cooling block while the heater is cooled;
a purge unit between a valve and the cooling block, the valve between the cooling device and the cooling block;
wherein the purge unit is configured to remove the cooling liquid from the cooling block while the heater generates heat.

3. A semiconductor manufacturing apparatus comprising:
a bonding head including a heater configured to heat a chip and bonding the chip onto a circuit board; and
a cooling block, adjacent to the heater, through which cooling liquid flows;
wherein the cooling liquid is removed from the cooling block while the heater generate heat, and
wherein the cooling liquid is supplied to the cooling block while the heater is cooled;
wherein the bonding head comprises a first bonding head and a second bonding head, and
wherein the first bonding head is configured to bond the chip at the bonding position by heating the chip while the second bonding head is cooled.

* * * * *